United States Patent [19]

Ikeda et al.

[11] Patent Number: 6,083,364
[45] Date of Patent: Jul. 4, 2000

[54] MAGNETRON SPUTTERING APPARATUS FOR SINGLE SUBSTRATE PROCESSING

[75] Inventors: Jiro Ikeda, Fujieda; Kyoji Kinokiri, Tokyo-to, both of Japan

[73] Assignee: Shibaura Mechatronics Kabushiki Kaisha, Yokohama, Japan

[21] Appl. No.: 09/269,051
[22] PCT Filed: Jul. 17, 1998
[86] PCT No.: PCT/JP98/03236
  § 371 Date: Mar. 18, 1999
  § 102(e) Date: Mar. 18, 1999
[87] PCT Pub. No.: WO99/04058
  PCT Pub. Date: Jan. 28, 1999

[30] Foreign Application Priority Data

Jul. 18, 1997 [JP] Japan .................................. 9-193530

[51] Int. Cl.[7] .......................... C23C 14/34; C23C 14/56; C23C 14/35; C23C 14/04; C23C 14/50
[52] U.S. Cl. ............................. 204/298.11; 204/298.15; 204/298.16; 204/298.19; 204/298.17; 204/298.23; 204/298.25; 204/298.27; 204/298.28; 204/298.2; 204/298.21; 204/298.22
[58] Field of Search .......................... 204/298.11, 298.15, 204/298.16, 298.19, 298.17, 298.23, 298.25, 298.27, 298.28, 298.2, 298.21, 298.22

[56] References Cited

U.S. PATENT DOCUMENTS 5,800,687  9/1998  Kempf ............................... 204/298.11
5,863,399  1/1999  Sichmann .......................... 204/298.19

FOREIGN PATENT DOCUMENTS

1-294242  11/1989  Japan .
6-2136    1/1994   Japan .
6-116721  4/1994   Japan .
7-57233   3/1995   Japan .
2286201   8/1995   United Kingdom .

*Primary Examiner*—Alan Diamond
*Attorney, Agent, or Firm*—Banner & Witcoff, Ltd.

[57] ABSTRACT

The purpose of this invention is to provide a magnetron sputtering apparatus capable of attaching masks on disk substrates and capable of conducting sputtering while disk substrates are being rotated on a central axis without complicated mechanisms or complicated processes. For this purpose, in the sputtering apparatus of this invention, a magnetic field generating means is provided above a sputtering chamber 11 so as to apply magnetic field in the sputtering chamber 11 providing discharge space. A target 21 is arranged at an upper portion of sputtering chamber 11 so that the magnetic field by generated the magnetic field generating means is applied to the target. A disk transport chamber 12 is provided which is connected to the sputtering chamber 11 through an opening 32 formed in a bottom wall 30. In disk transport chamber 12, a disk pusher 34 is provided on which a disk substrate 31 is placed for depositing sputter film. Disk pusher 34 transports the substrate 31 to the opening 32 of the sputtering chamber 11 and rotates the disk substrate 31 in the plane of the disk pusher. In the sputtering chamber 11, a rotation center mask 27 is provided which makes contact with the upper center portion of the disk substrate 31 placed on the disk pusher 34, and rotates with the rotation of the disk substrate 31.

17 Claims, 10 Drawing Sheets

MAGNETRON SPUTTERING APPARATUS FOR SINGLE SUBSTRATE PROCESSING

This application is a 371 of PCT/JP98/03236 filed Jul. 17, 1998.

FIELD OF INVENTION

The present invention relates to a sputtering apparatus, especially to a magnetron sputtering apparatus for single substrate processing suitable for manufacturing information recording media.

BACKGROUND OF THE INVENTION

Conventionally, magnetron sputtering apparatus for single substrate processing used for manufacturing information recording disks such as compact discs (CDS) or digital video discs (DVDs), the disk substrates are fixedly positioned opposing to the target which was provided in the vacuum chamber that composes the sputtering chamber. Sputtering was carried out through the masks fixed in the reaction chamber separately from the disk substrates, to cover the center portion and periphery portion of the disk substrates.

On the other hand, in the sputtering of MO (Magnet-optic) disks, the center masks and outer masks are previously attached to the disk substrates. Sputtering was carried out with the disk substrates rotating, after these mask-attached disk substrates are transported into the sputtering chamber of the sputtering apparatus.

However, one problem is that the composition distribution of the film formed at the surface of disk substrates, especially the distribution uniformity along the circumference and along the diameter of the disk substrate is not adequate, so it is impossible to form a film with satisfactory characteristics.

It is because in conventional magnetron sputtering apparatus used for manufacturing CDs or DVD disks, that sputtering is carried out under such condition that the disk substrates arranged in the sputtering chamber are fixed and do not rotate on the central axis of the disk substrate.

On the other hand, in conventional MO disk sputtering, the film thickness uniformity along the rotating direction is good because the sputtering is carried out while the disk substrates are rotating. But it has the drawback that attaching and detaching mechanism of masks to and from disk substrates or transporting mechanism are necessary to make mechanisms and process complicated because the disk substrates previously furnished with the center masks and the outer masks are transported into the sputtering chamber.

Besides, it had a drawback that when detaching masks from the disk substrates, sputtered film deposited on the mask is pealed off to contaminate disk surface film resulting in the decrease of product yield.

The purpose of this invention is to provide such apparatus capable of furnishing disk substrates with masks without complicated mechanisms and complicated process, and capable of sputtering during rotating the disk substrates on the central axis.

SUMMARY OF THE INVENTION

A magnetron sputtering apparatus for single substrate processing of the present invention comprises ;

a sputtering chamber wherein an airtight discharge space is provided, a magnetic field generating means arranged above said sputtering chamber, a target arranged at the upper portion of inside said sputtering chamber so that the magnetic field is applied by said magnetic field generating means, a disk transport chamber forming an airtight space which is connected to said sputtering chamber through the opening formed at the bottom wall of said sputtering chamber, a disk pusher provided in the disk transport chamber for supporting the disk substrate thereon, for transporting the disk substrate for depositing sputter film thereon to said opening portion of the sputtering chamber and for rotating said disk substrate in its surface plane, and a rotating center mask for contacting with central portion of the upper surface of said disk substrate placed on said disk pusher which is rotatably provided with the disk substrate in said sputtering chamber.

In the magnetron sputtering apparatus for single substrate processing according to the present invention, said rotating center mask is journaled by a bearing extended from the center portion of said target.

In the magnetron sputtering apparatus for single substrate processing according to the present invention, said target is provided with cylindrical water cooling jacket in the center portion, said rotation bearing is connected to said water cooling jacket.

In the magnetron sputtering apparatus for single substrate processing according to the present invention, the rotation axis of said disk pusher is eccentrically arranged from the center of said target.

In the magnetron sputtering apparatus for single substrate processing according to the present invention, said rotating center mask is journaled by a rotation bearing with "L" shaped cross section which is extended from the center portion of said target.

In the magnetron sputtering apparatus for single substrate processing according to the present invention, said "L" shaped cross section bearing is connected to a cylindrical water cooling jacket with clamp bolt.

In the magnetron sputtering apparatus for single substrate processing according to the present invention, said rotating center mask is rotatably supported at the central portion of the support bar bridged across the opening formed at the bottom wall of said sputtering chamber, said support bar being provided with shield plates for blocking sputtering particles emitted from said target to reach the surface of said disk substrate.

In the magnetron sputtering apparatus for single substrate processing according to the present invention, said shield plates are provided at least at one part between the both ends and center portion of said support bar, the width of which gradually increasing and gradually decreasing along the longitudinal direction of said support bar.

In the magnetron sputtering apparatus for single substrate processing according to the present invention, said support bar is equipped with a cooling jacket.

In the magnetron sputtering apparatus for single substrate processing according to the present invention, a ring shaped outer mask is provided at the periphery of the opening formed in the bottom wall of said sputtering chamber, said ring shaped outer mask being placed at the periphery of said disk substrates and when said disk pusher transports the disk substrates to the opening of said sputtering chamber.

In the magnetron sputtering apparatus for single substrate processing according to the present invention, said ring shaped outer mask is placed on the step formed at the periphery of the opening formed in the bottom wall of said sputtering chamber.

The embodiments of the present invention are illustrated below with the drawings.

DETAILED DESCRIPTION OF THE PREFERRED EMBODIMENTS

Figure 1:
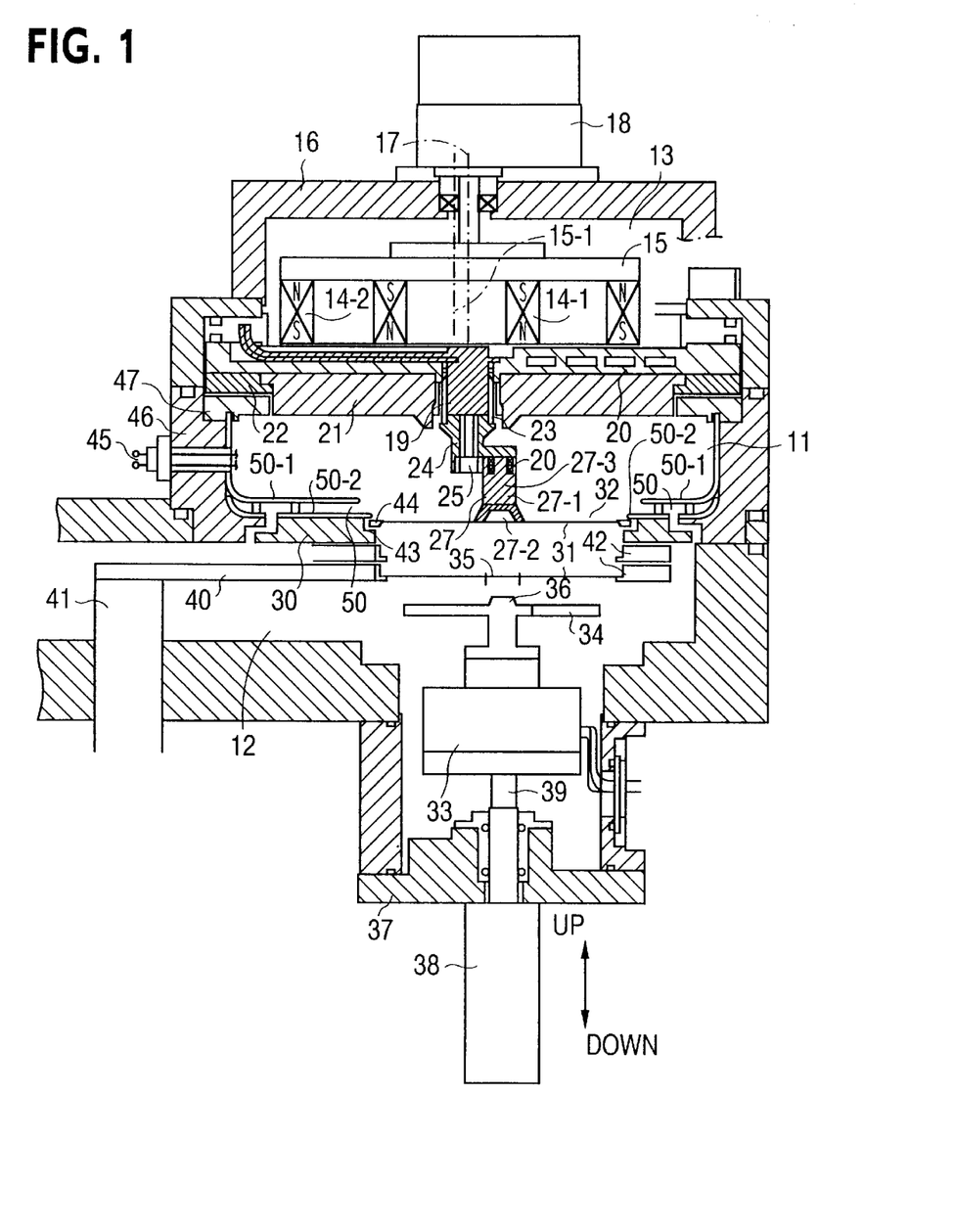
FIG. 1 is a cross section of a magnetron sputtering apparatus for single substrate processing showing one embodiment of this invention.

FIG. 1 is a cross section of the magnetron sputtering apparatus for single substrate processing showing an embodiment of the present invention.

The sputtering apparatus comprises a sputtering chamber 11 which is an airtight vessel having a nearly cylindrical shape, a disk transport chamber 12 which is also an airtight vessel provided under the sputtering chamber 11, a magnet chamber 13 provided on the sputtering chamber 11, the magnet chamber 13 being maintained at atmospheric pressure inside.

In the magnet chamber 13, ellipse shaped double ring magnets 14-1, 14-2 are concentrically fixed on the lower surface of a rotating magnet support member 15. The magnet support member 15 is fixed on the rotation shaft 17 extending through the ceiling wall 16 of the magnet chamber 13, the rotation shaft 17 being rotated by a magnet rotation motor 18 situated above the magnet chamber 13.

A backing plate 20 of a water cool jacket structure forms an upper inside wall of sputtering chamber 11. A disk shaped target 21 made of film composition is fixed on the lower surface of the backing plate 20 by a target holder 22 supporting the periphery of the target 21.

In the central part of the target 21, a center hole 23 is provided in which a cylindrical water cooling jacket 19 is extended. At the lower end of the cylindrical water cool jacket 19, the bearing 24 with "L" shaped section is connected by a clamp bolt 25. At the lower surface of horizontal portion of the "L" shaped bearing 24, a bearing 26 is fixed on which an end portion of cylindrical part 27-1 composing center mask 27 is rotably coupled.

An opening portion 32 for exposing the upper surface of the disk substrate 31 at sputtering chamber 11 is provided on the bottom wall 30 dividing the sputtering chamber 11 and the transport chamber 12. A vacuum motor 33 operated in vacuum and a disk pusher 34 which is rotated in a horizontal plane by the vacuum motor 33, are provided in the disk transport chamber 12. The disk pusher 34 is a metal disk having, at the center portion of the upper surface, a projection 36 extending through the center hole 35 of the disk substrate 31.

The projection 36 which extends through the center hole 35 upward, is inserted in the funnel shaped concave portion 27-2 formed at the lower end of the cylindrical portion 27-1 constructing the center mask 27. The vacuum motor 33 and the disk pusher 34 coupled therewith reciprocate upward and downward inside the disk transport chamber 12 by the shaft 39 of the cylinder 38 installed through the bottom plate 37 of the disk transport chamber 12.

In the disk transport chamber 12, one end of the disk transport arm 40 is fixed on a rotating shaft 41. A ring shaped susceptor portion 42 for mounting disk substrate 31 is formed on the other end of the disk transport arm 40. The disk transport arm 40 rotates in the range of about 90 degree on the rotation shaft 41. The disk substrate 31 is placed on the ring shaped susceptor portion 42 from outside the disk transport chamber 12 at an angle position (not illustrated) 90 degree from the angle position illustrated. After the disk substrate 31 is placed on the ring shaped susceptor portion 42, the disk transport arm 40 rotates 90 degree, thereby the disk substrate 31 being transported to the portion under the opening 32 of the sputtering chamber 11. In the situation, the shaft 39 of the cylinder 38 moves upward and the disk pusher 34 inserts its projection 36 into the center hole 35 to push the disk substrate 31 above the susceptor portion 42. The upward motion is stopped when the disk substrate 31 is in contact with the concave portion 27-2 of the center mask 27. At the stop position, the disk substrate 31 is placed in the opening portion 32 provided in the bottom wall 30 of the sputtering chamber 11. The ring shaped outer mask 44 placed at a step portion 43 formed in the wall around the opening portion 32 of the bottom wall 30, is pushed upward to be placed on the periphery of the disk substrate 31. In this state, the vacuum motor 33 begins to rotate and the sputtering is carried on.

Figure 2:
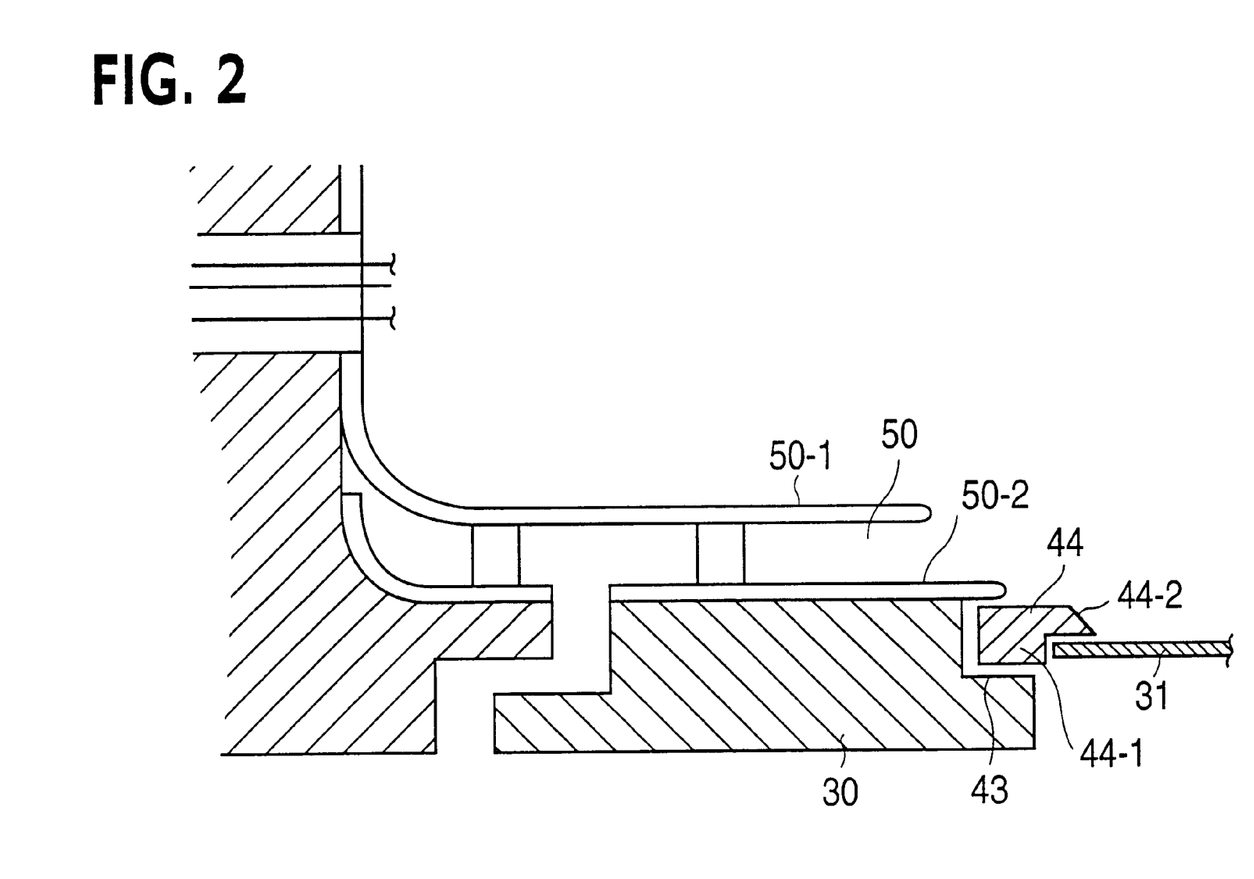
FIG. 2 is a partial enlarged view of the outer outer mask 44 set on step 43 formed in the bottom wall 30 of the sputtering chamber 11 shown in FIG. 1.

FIG. 2 is a partly enlarged view of the disk substrate 31 and the ring shaped outer mask 44 placed at the bottom wall 30 of the sputtering chamber 11. The outer mask 44 has an inverted "L" cross section and a vertical portion 44-1 in the cross section is placed on the step portion 43 until the disk substrate 31 reaches the sputter position. When disk substrate 31 has risen to the sputter position, the vertical portion 44-1 is detached from the step portion 43 and the horizontal portion 44-2 in the inverted "L" cross section is placed on the periphery of the disk substrate 31 to be rotated with the rotation of the disk substrate 31.

Argon gas is introduced into the sputtering chamber 11 from the gas inlet 45. High voltage for discharge is applied across the backing plate 20 and the anode ring 47 to which the side wall 46 of the sputtering chamber 11 is connected at the upper end. The magnetic field generated by the double ring magnet 14-1, 14-2 in the magnet chamber 13 is applied in the sputtering chamber 11. Plasma discharge is thus generated in the sputtering chamber 11. During the discharge, the magnet support member 15 on which the double ring magnet 14-1, 14-2 is fastened is rotated by the magnet rotation motor 18. The rotation shaft 17 of the magnet support member 15 is arranged eccentrically from the center axis 15-1 of the magnet support member 15. By rotating the double ring magnet 14-1, 14-2 around the rotation shaft 17, the erosion of the surface of the target 21 is uniformly generated over the wide range.

During the discharge, the disk substrate 31 placed on the disk pusher 34 is rotated by the vacuum motor 33, the rotation center shaft 27-3 of which is arranged eccentrically from the center shaft 21-1 of the target 21. By this arrangement, all over the surface of the disk substrate 31, film is formed by sputtering with uniform thickness both in circumferential and radial direction .

When the disk substrate 31 rotates, the center mask 27 rotates together with the disk substrate 31 by "L" shaped bearing on which bearing 26 is fixed, since the projection 36 of the disk pusher 34 is inserted into the concave portion 27-2 of the center mask 27. By this configuration, the center mask 27 has not only a masking function of preventing the deposition of the sputter material on the central portion of the rotating disk substrate 31, but also has a function of stably holding disk substrate 31 on the disk pusher 34 by continuously applying pressure on the surface of the rotating disk substrate 31.

On the other hand, an electron trap 50, composed from a pair of copper plates 50-1, 50-2 arranged to face each other with a narrow gap, is provided on the bottom wall 30 of the sputtering chamber 11. When the target 21 is made of an insulator such as Si, insulator material deposits on the inside wall of the sputtering chamber 11 by sputtering, resulting in prevention of the flow of electrons generated in the discharge space of the sputtering chamber 11 into the inside wall of the sputtering chamber 11 making it difficult to maintain a stable discharge.

The electron trap 50 applies the phenomenon that the gap formed by a pair of copper plates 50-1, 50-2 prevents the intrusion of insulator material and traps electrons at the gap to maintain a stable discharge. One copper plate 50-2 forming the electron trap 50 contacts with the bottom wall 30 of the sputtering chamber 11, the end of which is extended further to cover the outer mask 44 provided at the bottom opening 32 of the sputtering chamber 11.

The magnet chamber 13 is rotatably coupled with the sputtering chamber 11 by a hinge structure (not illustrated). The magnet chamber 13 is so constructed that the magnet chamber 13 may manually turned upward to keep the sputtering chamber 11 and the disk transport chamber 12 in open position so that the maintenance operation are possible.

Figure 3:
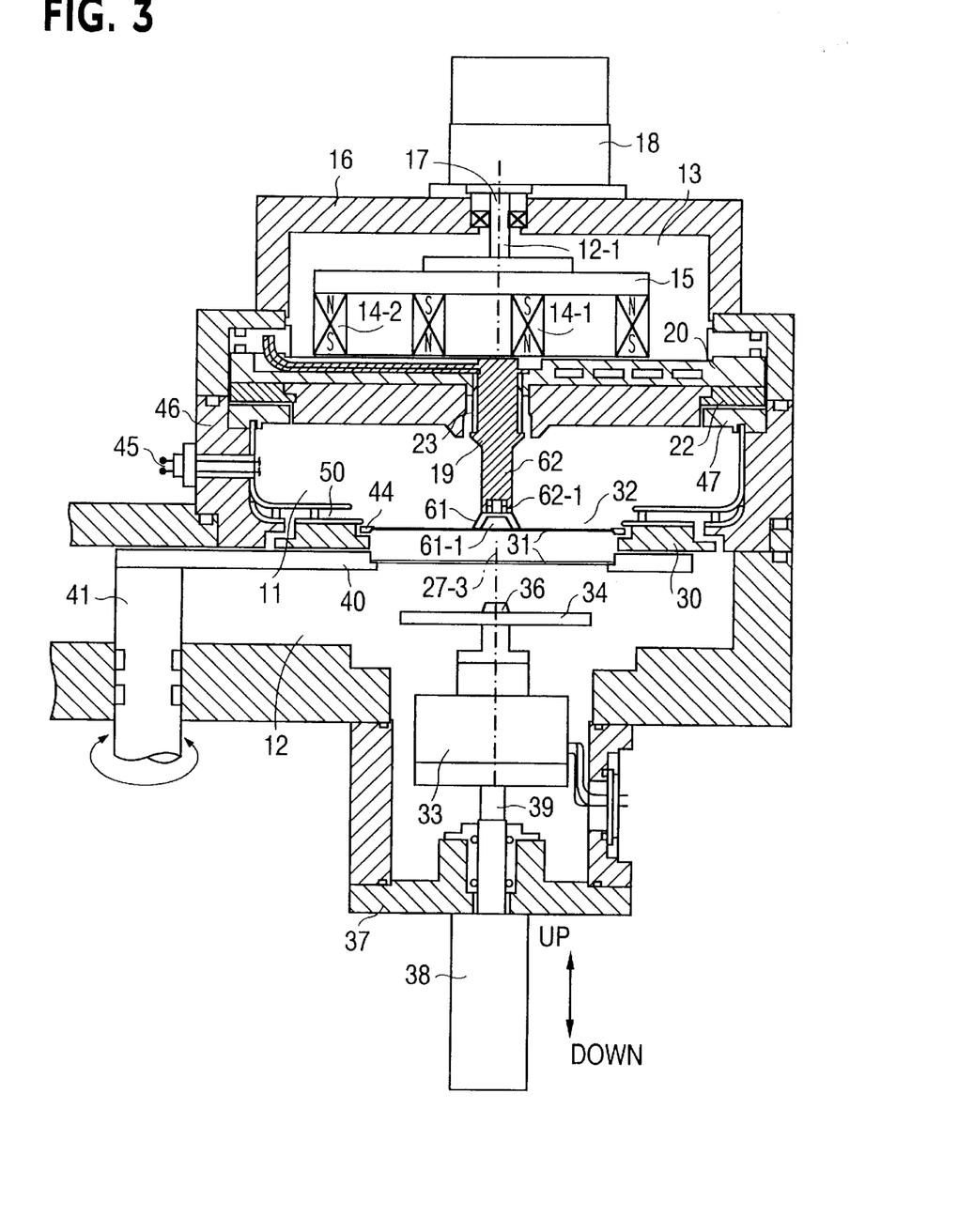
FIG. 3 is a cross section of the sputtering apparatus showing another embodiment of the invention.
Figure 4:
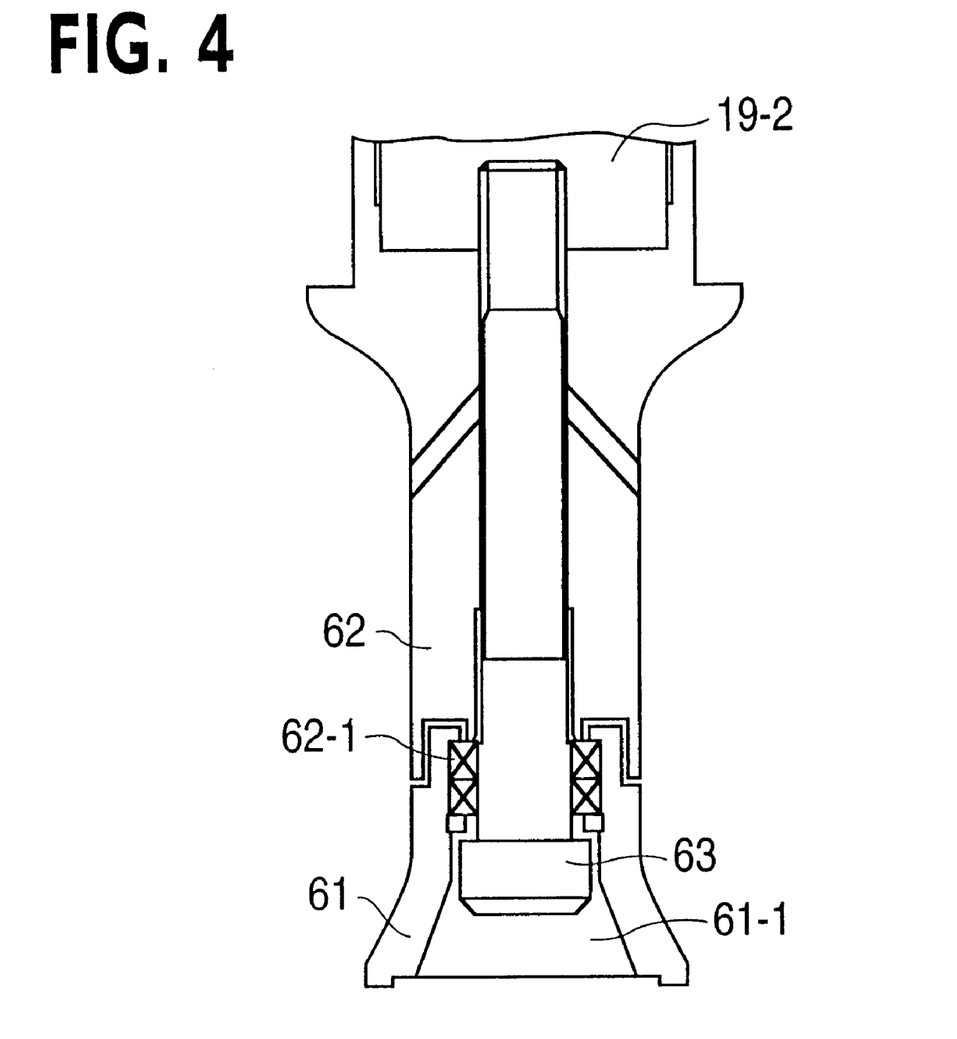
FIG. 4 is an enlarged view of a part of the sputtering apparatus shown in FIG. 3.

FIG. 3 is a cross section of the sputtering apparatus showing another embodiment of the invention, and FIG. 4 is an enlarged view of the main portion of FIG. 3. In FIG. 3 and FIG. 4, the corresponding components with FIG. 1 are indexed with the same symbols and detailed descriptions are omitted. In the embodiment, the rotation axis 27-3 of the disk substrate 31 is arranged concentrically with the center shaft 21-1 of the target 21, instead of being eccentrical. The funnel shaped center mask 61 having a concave portion 61-1 into which the projection 36 of the disk pusher 34 is inserted is coupled rotatably through the ball bearing mechanism 62-1 with the bottom end of the cylindrical bearing 62 which is extended downward through the center hole 23 of the target 21. The ball bearing mechanism 62-1 is provided around the bolt 63 coupled at the hollow portion of the cylindrical bearing 62. The funnel shaped center mask 61 is coupled with the ball bearing mechanism 62-1 wherein the ball bearing mechanism 62-1 is stored inside the upper end hollow portion of the funnel shaped center mask 61 as is shown in FIG. 4. The upper portion of the cylindrical bearing 62 is cooled by the cylindrical water cooling jacket 19-2 of the backing plate 20 and the center mask connected therewith is also cooled.

Figure 5:
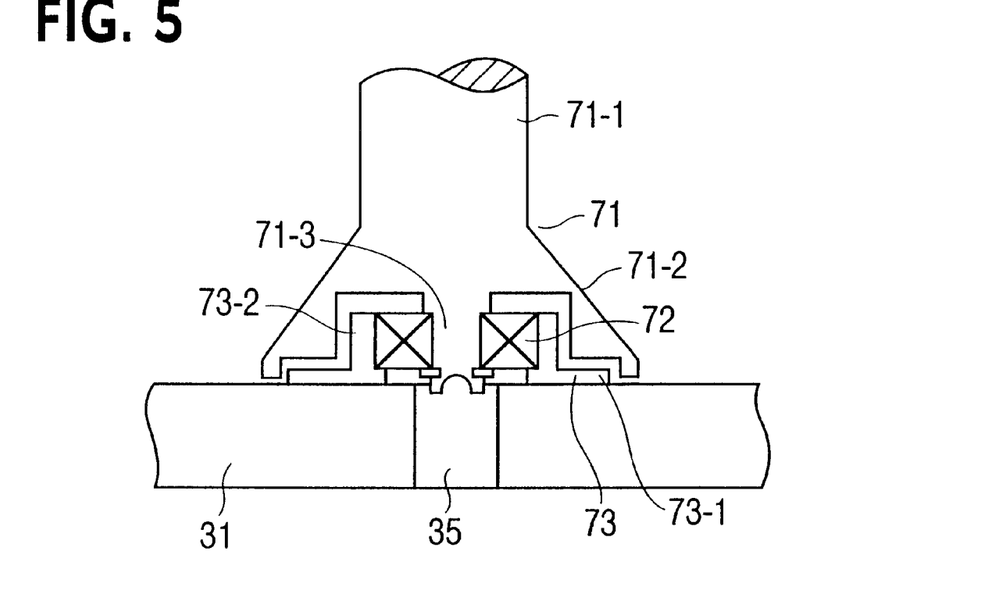
FIG. 5 is an enlarged view of the center mask portion showing further different embodiment of this invention.

FIG. 5 is an enlarged view of the center mask portion showing a further embodiment of the invention. In this embodiment, the center mask 71 comprises a cylindrical portion 71-1 extending downward through the center hole 23 of the target 21, a funnel shaped large diameter portion 71-2 provided at the lower end, a ball bearing mechanism 72 embedded rotatably around the shaft column 71-3 and a ring shaped rotating disc 73 provided around the shaft column 71-3 by the ball bearing mechanism 72. The ring shaped rotation disk 73 comprises a horizontal portion 73-1 contacting with the surface of disk substrate around the center hole 35 and a vertical portion 73-2 forming a part of the ball bearing mechanism 72. When the disk substrate 31 is moved upward by the disk pusher (not illustrated), the surface of the disk substrate 31 contacts with the horizontal portion 73-1 of the ring shaped rotation disk 73, by the friction of the contact surfaces and rotates with the rotation of the disk substrate 31. On the contrary, the large diameter portion 71-2 is separated from the surface of the disk substrate with a gap of 0.2 to 0.3 mm, so that it stands still in spite of the rotation of the disk substrate 31.

Figure 6:
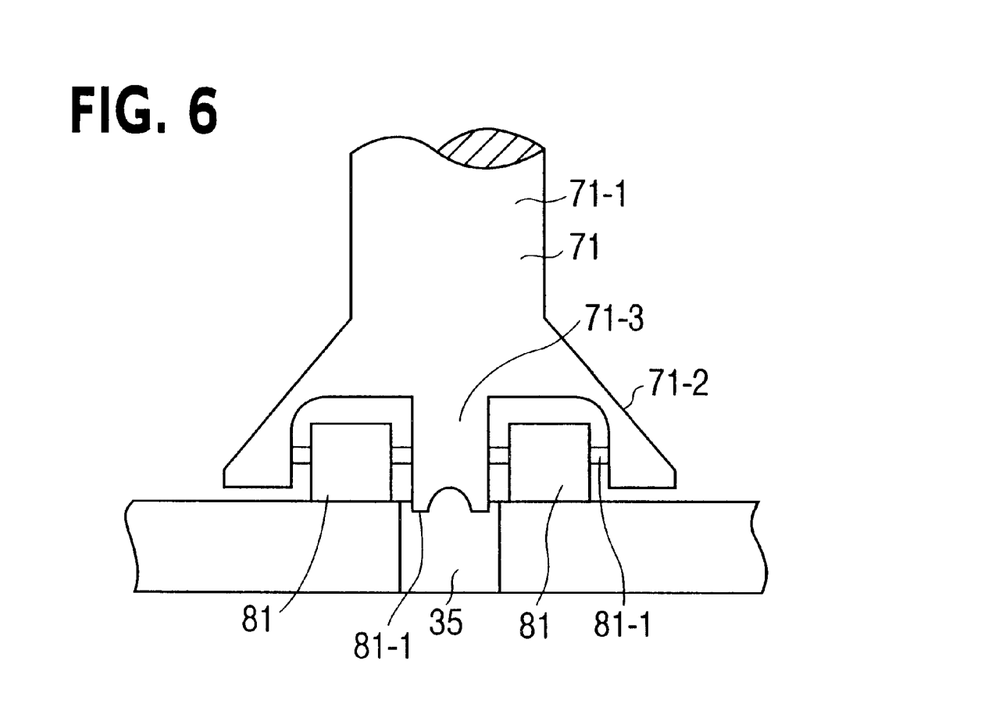
FIG. 6 is an enlarged view of the center mask portion showing further different embodiment of this invention.
Figure 7:
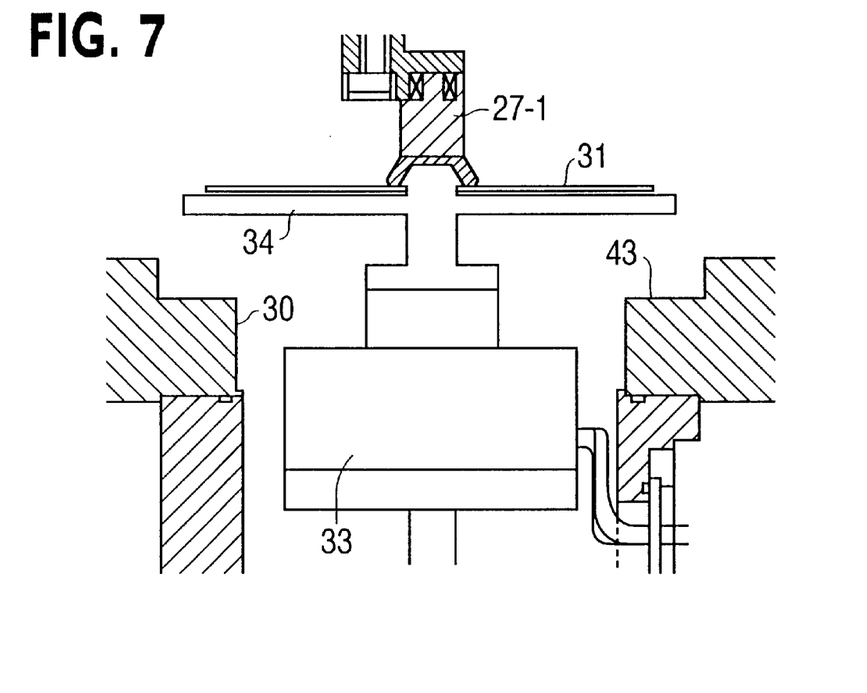
FIG. 7 is a section of a part showing further different embodiment of this invention.
Figure 8:
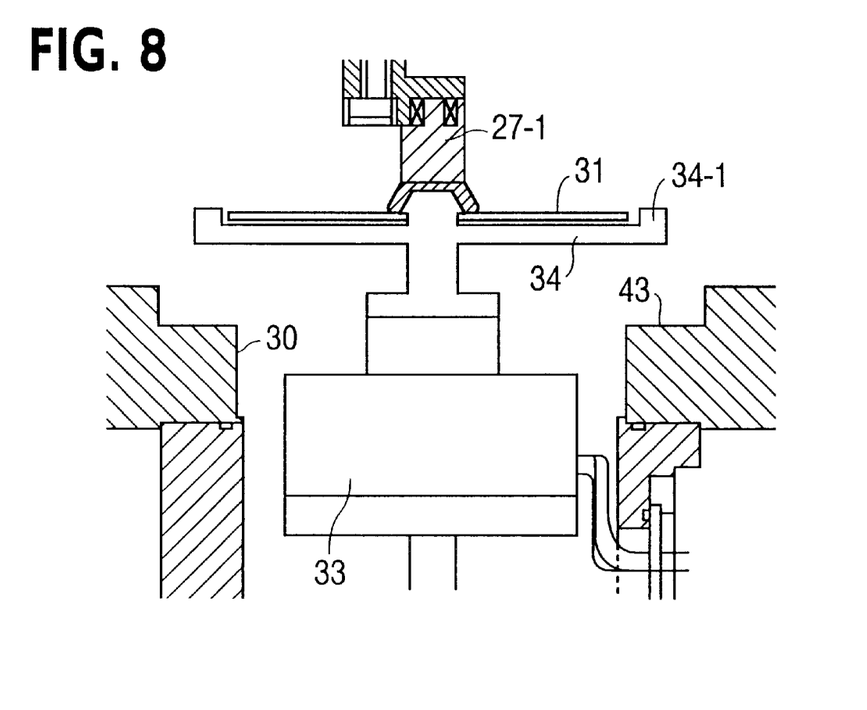
FIG. 8 is a section of a part showing further different embodiment of this invention.

FIG. 6 is an enlarged view of the center mask portion illustrating a further embodiment of the invention. In this embodiment, a plurality of rollers 81 arranged in the radial direction around the shaft column 71-3 are used, instead of using the ball bearing mechanism 72 illustrated in the embodiment in FIG. 5. The plurality of rollers 81 make contacts with the surface of the disk substrate 31 when the disk substrate 31 is moved upward by the disk pusher (not illustrated), and they rotate around the horizontal rotation shaft 81-1 with the rotation of the disk substrate 31. On the contrary, the large diameter portion 71-2 of the center mask 71 is separated from the disk substrate 31 by a small gap, the same as shown in FIG. 5, it stands still in spite of the rotation of the disk substrate 31.

In the embodiment mentioned above, the outer outer mask 44 is used which is rotating with the disk substrate 31 during the sputtering operation. If sputter film is necessary at the outer periphery of the disk substrate 31, the outer outer mask 44 can be omitted. When it is necessary not to deposit sputter film on the side surface of outer periphery of the disk substrate 31, a ring shaped vertical wall 34-1 should be provided around the disk substrate 31 of the disk pusher 34.

Figure 9A:
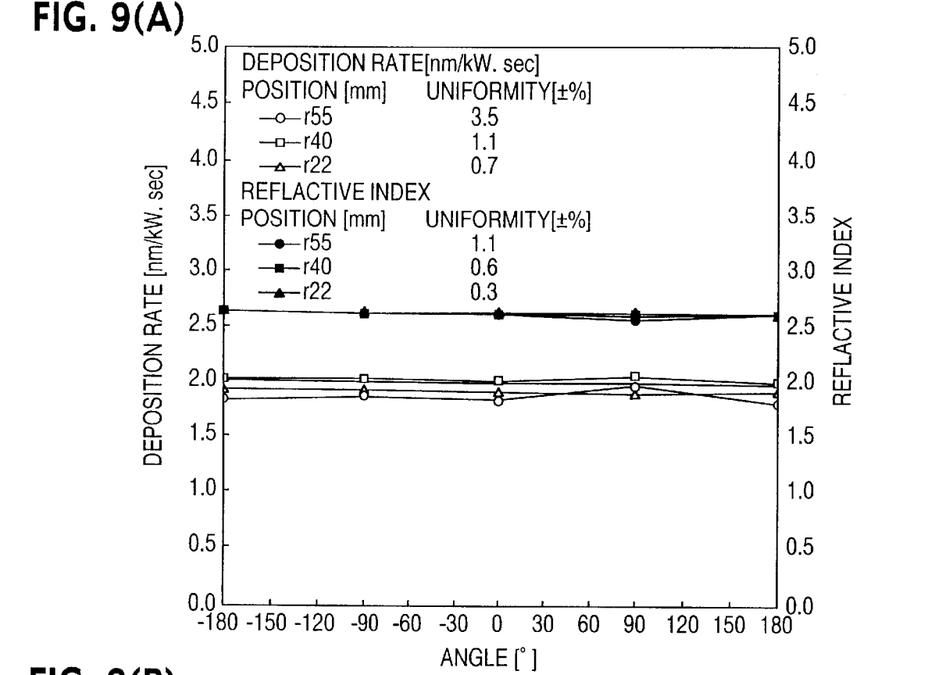
FIG. 9 is a graph showing film thickness uniformity produced by the sputtering apparatus of this invention comparing with that produced by the conventional apparatus, wherein (A) shows data by this invention, (B) shows that by the conventional apparatus.
Figure 9B:
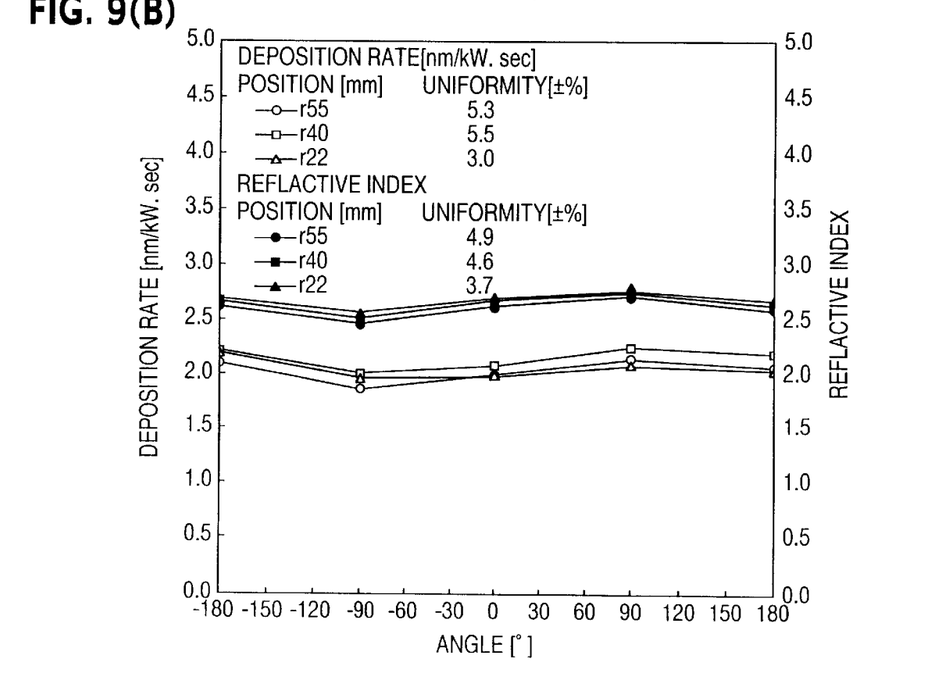

FIG. 9 is a graph showing an example of film thickness uniformity formed on the disk substrate surface by the sputter apparatus shown as an embodiment of this invention described above, comparing with the film thickness uniformity by conventional sputtering apparatus. (A) and (B) In FIG. 9 designate data according to the invention and that of conventional sputtering respectively. In these graphs, the horizontal axis indicates circumferential angle of the disk substrate and the vertical axis indicates deposition rate (nm/kw.sec) and refractive index. In this graph, the broken line plotted by white triangle, white square, and white circle indicate the deposition rate on each circumference of r=22 mm, r=40 mm and r=55 mm of the disk substrates respectively. The broken line plotted by black triangle, black square and black circle indicate refractive index on each circumference of r=22 mm, r=40 mm, and r=55 mm of the disk substrates respectively.

As is shown in the graph (B) in FIG. 9, the deposition rate distribution and refractive index of the sputtered film vary from ±3.0 to ±5.3 and ±3.7 to ±4.9, respectively. On the other hand, as is shown in the graph (A), the growth rate distribution and the refractive index of the surface of the disk substrate by the sputtering apparatus of the invention wherein the disk substrate rotates, the circumferential distribution vary from ±0.7 to ±3.5, and from ±0.3 to ±1.1, respectively, showing a remarkable decrease in fluctuation.

Figure 10:
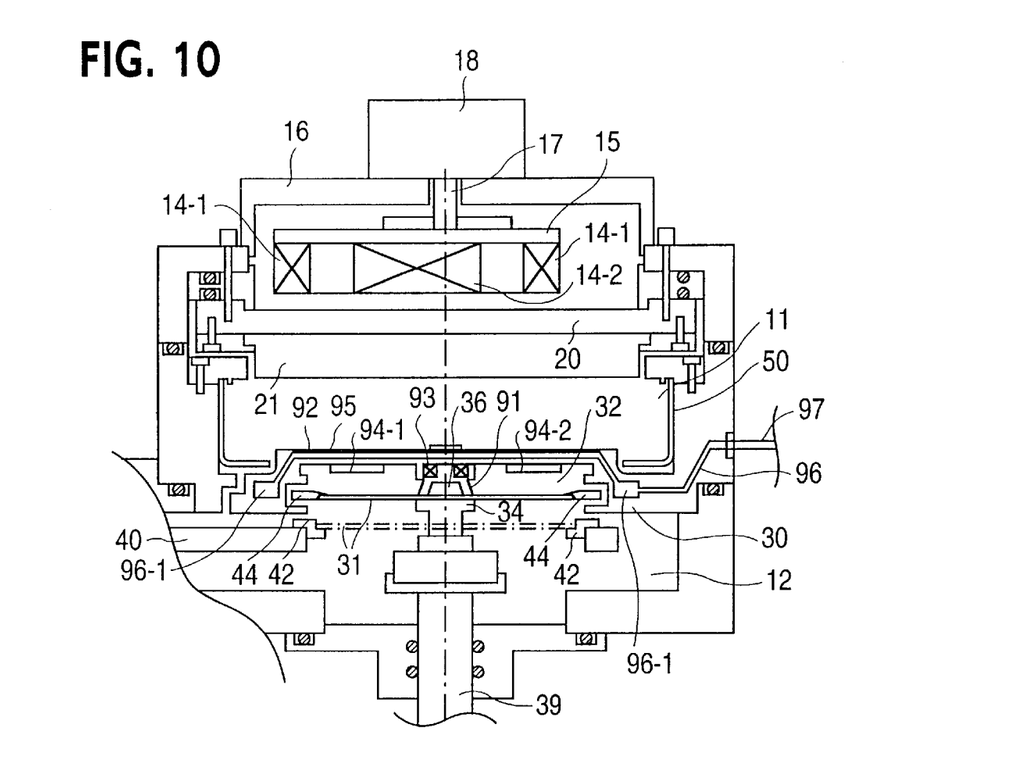
FIG. 10 is a part of cross section of the sputtering apparatus showing further different embodiment of this invention.
Figure 11:
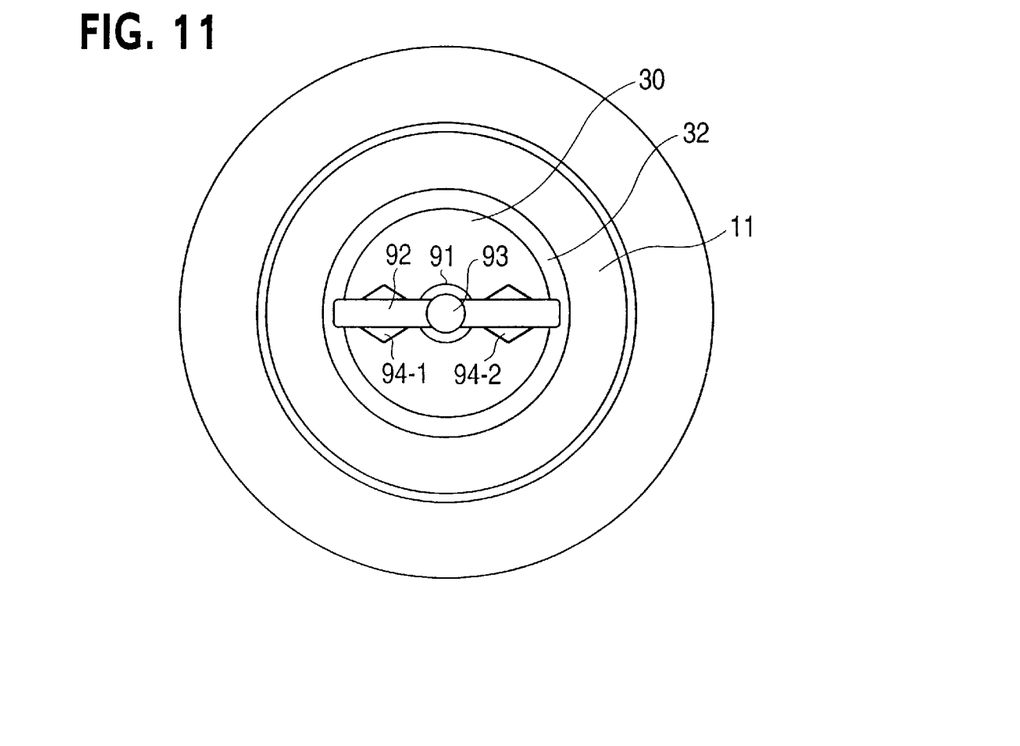
FIG. 11 is a top view of the center mask portion of the sputtering apparatus shown in FIG. 10.

FIG. 10 and FIG. 11 are the cross section and the top view of a main portion showing a further embodiment of the invention. In these Figs, the same symbols are given to the same components as FIG. 1. In this embodiment, the center mask 91 is supported on the center portion of the center bar 92 which is bridged and fastened across the center portion of the opening 32 through which the disk transport chamber 12 and the sputtering chamber 11 are coupled with each other, said opening 32 being provided on the bottom wall 30 of the sputtering chamber 11. As is shown in the top view of FIG. 11, this support bar 92 is fastened at both ends on the upper surface of the bottom wall 30 of the sputtering chamber 11. At the center portion of the support bar 92, a bearing 93 is provided with which the center mask 91 is supported rotatably. Shielding plates 94-1, 94-2 are fixed between both ends and the center portion respectively. The widths of these shielding plates 94-1, 94-2 gradually increase and gradually decrease, compared with the width of the support bar 9 2, along the longitudinal direction of the support bar 92. The support bar 92 is made of, for example, copper(Cu) and the shielding plates 94-1, 94-2 are made of copper or stainless steel. They are fastened by bolts with each other. On the center portion of the cross section surface of the support bar 92, a water cool jacket 95 is provided through which cooling water is flowed along the longitudinal direction. This water cool jacket 95 is connected with the cooling water pipe 97 which is open at the outer portion of the sputtering chamber 11 through the cooling water path 96. The cooling water path 96 is provided within the bottom wall 30 of the sputtering chamber and within the side wall of the sputtering chamber 11. Thus, the cooling water introduced through cooling water pipe 97 is supplied into the water cooling jacket 95 from one end of the support bar 92 through the cooling water path 96 provided within the bottom wall 30 of the sputtering chamber 11. The cooling water supplied into the water cooling jacket 95 flows from the other end of the support bar 92 into the cooling water path 96 provided within the bottom wall 30 of the sputtering chamber 11 and then flows around the opening 32. The water is then exhausted to outside sputtering chamber 11 through cooling water exhaust pipe (not illustrated) arranged adjacent to the cooling water pipe 97.

According to the sputtering apparatus of this embodiment, the disk substrate 31 transported to the disk pusher 34 from the susceptor 42 provided on the end of the disk transport arm 40 is rotated by the vacuum motor 33 together with the center mask 91 in the situation that the projection 36 of the disk pusher 34 is fitting with the convex portion of the center mask 91 at the rise of cylinder shaft 39. In this situation, target material emitted from the target 21 is sputtered on the surface of the disk substrate 31 while a part of the target material is shielded by the shielding plates 94-1, 94-2, so that the target material may not reach the surface of the disk substrate 31. As a result, the circumferential and radial film thickness uniformity of the sputtered film on the surface of the disk substrate 31 is thus controlled to obtain a uniform distribution.

Figure 12:
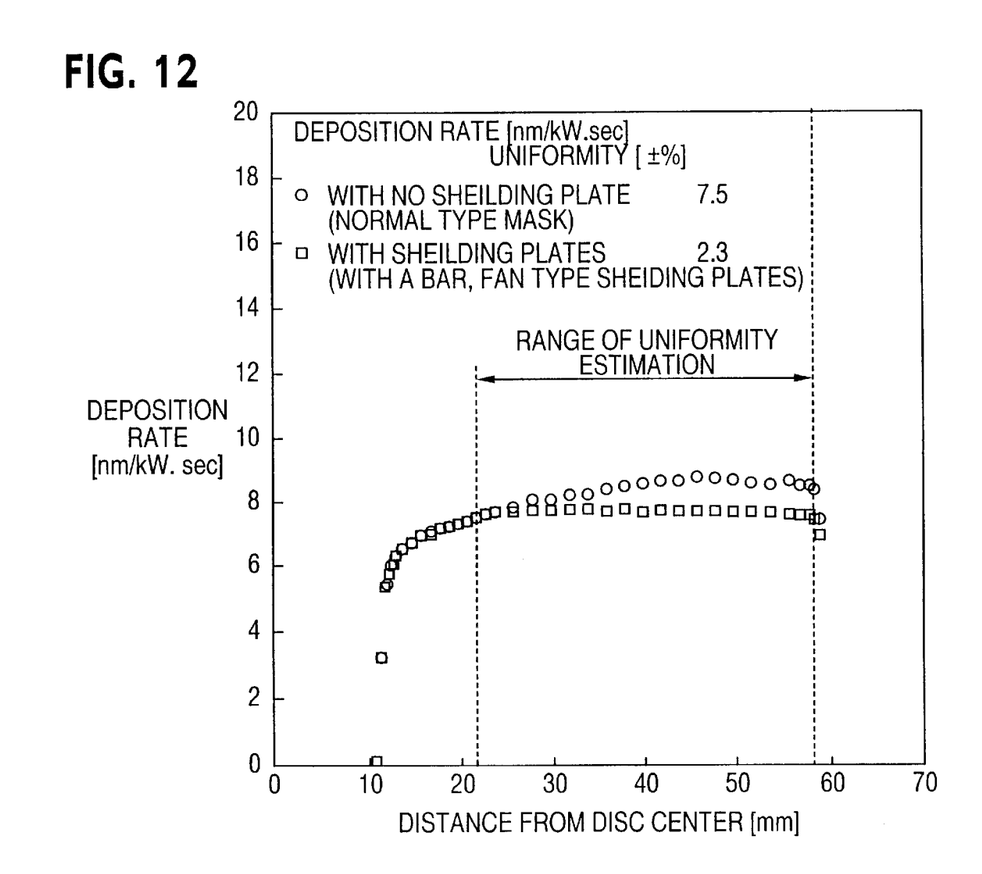
FIG. 12 is a graph showing the film thickness uniformity produced by the sputtering apparatus shown in FIG. 10. comparing with that produced by the conventional apparatus.

FIG. 12 is a graph showing one example of film thickness uniformity of the disk substrate produced by the sputtering apparatus according to the invention. The film thickness uniformity of the disk substrate with shielding plates 94-1, 94-2 (square plots in the graph) and without shielding plate (circle plots in the graph) are shown. The horizontal axis designates the radius of the disk substrates (mm) and the vertical axis designates the growth rate (nm/kw.sec). This graph shows that without shielding plates 94-1, 94-2, the growth rate is high at the center part of the radial direction i.e. at the center part of the recording area and the growth rate is low at the end of radial direction of the disk substrate. On the other hand, the growth rate is nearly uniform all over the radial direction of the disk substrate when the shielding plates 94-1, 94-2 are provided.

The various shapes of the shielding plates 94-1, 94-2 fixed on the support bar 92 in this embodiment, can be designed so as to make thickness uniformity uniform, by simulations or experiments.

Figure 13:
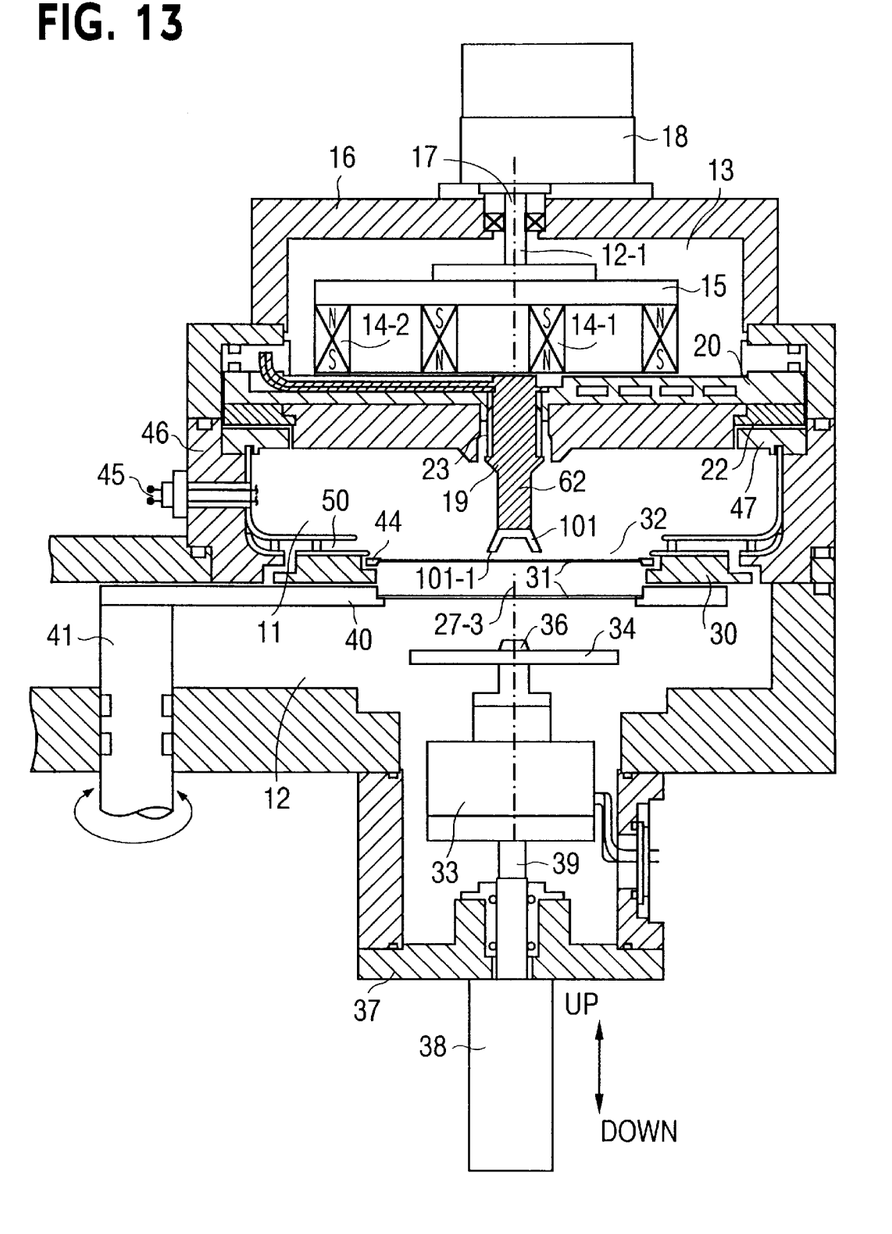
FIG. 13 is a cross section of the sputtering apparatus showing a further different embodiment of the present invention.

FIG. 13 is a cross section of the sputtering apparatus showing a further embodiment of the invention. In this figure the same components as FIG. 3 are indexed with the same symbols and detailed description is omitted. In this embodiment, the center mask 101 is fastened to the bottom end of the cylindrical supporter 102 which is extended downward through the center hole 23 of the target 21. The bottom end 101-1 with the funnel shaped opening of the center mask 101 is so provided that it does not contact with the surface of the disk substrate 31 but is separated with a small gap between the surfaces. By this configuration, the disk substrate 31 placed on the disk pusher 34 rotates. The center mask 101 itself does not rotate but keeps stationary all the time. In this situation, the center mask 101 does not have the function to press the disk substrate 31 tightly on the disk pusher 34, but keeps a masking function to prevent the depositing of sputter material on the center portion.

The center mask which does not rotate by itself and keeps stationary at a position slightly apart from the surface of the disk substrate as mentioned above, is applicable for the apparatus shown in FIG. 1 or FIG. 10.

EFFECT OF THE INVENTION

As mentioned above, with a magnetron sputtering apparatus for single substrate processing according to the present invention, a uniform film distribution is attained all over the surface of the disk substrate with a simple structure in which a rotating center mask is provided in the sputtering chamber which is provided in contact with the center portion of the disk substrate thereby rotating with the disk substrate.

What is claimed is:

1. A magnetron sputtering apparatus for single substrate processing comprising:

a sputtering chamber wherein an airtight discharge space is provided, a magnetic field generating means located above said sputtering chamber, a target provided on an upper portion of said sputtering chamber to which is applied a magnetic field generated by said magnetic field generating means, a disk transport chamber providing an airtight space connected to said sputtering chamber through an opening formed in a bottom wall of said sputtering chamber, a disk pusher provided inside said disk transport chamber for transporting a disk substrate for forming sputter film thereon to the opening of said sputtering chamber and for rotating said disk substrate thereon, and a rotating center mask for contacting with an upper central portion of said disk substrate and being provided inside said sputtering chamber rotatively with the rotation of said disk substrate.

2. The magnetron sputtering apparatus for single substrate processing according to claim 1, characterized in that said rotating center mask is journaled by a bearing extended from a central portion of said target.

3. The magnetron sputtering apparatus for single substrate processing according to claim 2, characterized in that a cylindrical water cooling jacket is provided extending through the central portion of said target, said bearing being connected with said water cooling jacket.

4. The magnetron sputtering apparatus for single substrate processing according to claim 1, characterized in that a rotation shaft of said disk pusher is arranged eccentrically from the center of said target.

5. The magnetron sputtering apparatus for single substrate processing according to claim 1, characterized in that said center mask is journaled by a rotation bearing having an L shaped cross section which is extended from a central portion of said target.

6. The magnetron sputtering apparatus for single substrate processing according to claim 3, characterized in that an L shaped bearing is connected with the cylindrical water cooling jacket by clamp bolts.

7. The magnetron sputtering apparatus for single substrate processing according to claim 1, characterized in that said rotating center mask is supported rotatively at a central portion of a support bar bridged across the opening formed in the bottom wall of said sputtering chamber, said support bar being equipped with at least one shielding plate for preventing sputter material emitted from said target from reaching the surface of said substrate.

8. The magnetron sputtering apparatus for single substrate processing according to claim 7, characterized in that a said shielding plate is provided on at least one side between an end and the central portion of said support bar, having such a shape that the width of said shielding plate gradually increases and after that gradually decreases along a longitudinal direction along said support bar.

9. The magnetron sputtering apparatus for single substrate processing according to claim 8, characterized in that said support bar is equipped with a cooling jacket.

10. The magnetron sputtering apparatus for single substrate processing according to claim 1, characterized in that a ring shaped mask is provided on the periphery of the opening of said sputtering chamber and, when said disk pusher transports the disk substrate to the opening of said sputtering chamber, said ring shaped mask is placed on the outer periphery of said disk substrate and is rotated with the rotation of the disk substrate.

11. The magnetron sputtering apparatus for single substrate processing according to claim 1, characterized in that a ring shaped mask is located on a step provided at the periphery of the opening of said sputtering chamber.

12. A magnetron sputtering apparatus for single substrate processing comprising:

a sputtering chamber wherein an airtight discharge space is provided, a magnetic field generating means for generating a magnetic field inside said sputtering chamber, a target arranged inside said sputtering chamber to which a magnetic field generated by said magnetic field generating means can be applied, a disk transport chamber which provides an airtight space connected to said sputtering chamber through an opening formed in a bottom wall of said sputtering chamber, a disk pusher provided in said disk transport chamber for holding a disk substrate, for transporting the disk substrate to the opening of said sputtering chamber and for rotating said disk substrate in a plane, and a center mask fixedly arranged with a gap formed between a portion of the center mask and a central part of the surface of a disk substrate held on said disk pusher.

13. The magnetron sputtering apparatus for single substrate processing according to claim 12, characterized in that said center mask is fastened on a cylindrical supporter extended from a central portion of said target.

14. The magnetron sputtering apparatus for single substrate processing according to claim 13, characterized in that a rotation shaft of said disk pusher is arranged eccentrically from the center of said target.

15. The magnetron sputtering apparatus for single substrate processing according to claim 12, characterized in that said center mask is supported on a central portion of a support bar bridged across the opening formed in the bottom wall of said sputtering chamber and that said support bar is equipped with at least one shield plate for preventing sputter material emitted from said target from reaching the surface of said disk substrate.

16. The magnetron sputtering apparatus for single substrate processing according to claim 15, characterized in that a said shielding plate is provided on at least one side between an end and the central part of said support bar and the shape of said shielding plate being such that the width gradually increases and after that gradually decreases along a longitudinal direction of said support bar.

17. The magnetron sputtering apparatus for single substrate processing according to claim 16, characterized in that said support bar is equipped with a cooling jacket.

* * * * *